United States Patent
Nejati et al.

(10) Patent No.: US 8,536,950 B2
(45) Date of Patent: Sep. 17, 2013

(54) MULTI-STAGE IMPEDANCE MATCHING

(75) Inventors: Babak Nejati, San Diego, CA (US); Yu Zhao, San Diego, CA (US); Nathan M Pletcher, Encinitas, CA (US); Aristotele Hadjichristos, San Diego, CA (US); Puay Hoe See, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/641,228

(22) Filed: Dec. 17, 2009

(65) Prior Publication Data

US 2011/0037516 A1    Feb. 17, 2011

Related U.S. Application Data

(60) Provisional application No. 61/230,976, filed on Aug. 3, 2009, provisional application No. 61/231,242, filed on Aug. 4, 2009.

(51) Int. Cl.
*H03F 3/04* (2006.01)

(52) U.S. Cl.
USPC ............................................ 330/302; 330/51

(58) Field of Classification Search
USPC ................................. 330/302, 51, 124 R, 295
See application file for complete search history.

(56) References Cited

U.S. PATENT DOCUMENTS

| | | | |
|---|---|---|---|
| 3,325,738 A | 6/1967 | Busby | |
| 3,469,195 A | 9/1969 | Harwood | |
| 3,514,710 A | 5/1970 | Janning, Jr. | |
| 3,665,507 A | 5/1972 | Peil | |
| 3,886,380 A | 5/1975 | Sobajima et al. | |
| 4,041,396 A | 8/1977 | Fedde | |
| 4,054,849 A | 10/1977 | Yamada | |
| 4,158,180 A | 6/1979 | Challen | |

(Continued)

FOREIGN PATENT DOCUMENTS

| | | |
|---|---|---|
| EP | 0537733 A2 | 4/1993 |
| EP | 0594358 A2 | 4/1994 |

(Continued)

OTHER PUBLICATIONS

"International Search Report and Written Opinion—PCT/US2010/044306, International Search Authority—European Patent Office—Dec. 8, 2010."

(Continued)

*Primary Examiner* — Henry Choe
(74) *Attorney, Agent, or Firm* — Ramin Mobarhan (57) ABSTRACT

Exemplary techniques for performing impedance matching are described. In an exemplary embodiment, the apparatus may include an amplifier (e.g., a power amplifier) coupled to first and second matching circuits. The first matching circuit may include multiple stages coupled to a first node and may provide input impedance matching for the amplifier. The second matching circuit may include multiple stages coupled to a second node and may provide output impedance matching for the amplifier. At least one switch may be coupled between the first and second nodes and may bypass or select the amplifier. The first and second nodes may have a common impedance. The apparatus may further include a second amplifier coupled in parallel with the amplifier and further to the matching circuits. The second matching circuit may include a first input stage coupled to the amplifier, a second input stage coupled to the second amplifier, and a second stage coupled to the two input stages via switches.

27 Claims, 8 Drawing Sheets

(56) References Cited

U.S. PATENT DOCUMENTS

| | | |
|---|---|---|
| 4,207,538 A | 6/1980 | Goel |
| 4,223,274 A | 9/1980 | Paulke et al. |
| 4,263,560 A | 4/1981 | Ricker |
| 4,320,350 A | 3/1982 | Drapac |
| 4,380,711 A | 4/1983 | Cunningham |
| 4,426,625 A | 1/1984 | Harwood et al. |
| 4,439,744 A | 3/1984 | Kumar et al. |
| 4,447,783 A | 5/1984 | Quick |
| 4,495,648 A | 1/1985 | Giger |
| 4,500,848 A | 2/1985 | Marchand et al. |
| 4,510,460 A | 4/1985 | Tamura |
| 4,514,702 A | 4/1985 | Zogg |
| 4,523,155 A | 6/1985 | Walczak et al. |
| 4,560,949 A | 12/1985 | Young |
| 4,578,603 A | 3/1986 | McPherson |
| 4,592,252 A | 6/1986 | Ecer |
| 4,593,409 A | 6/1986 | Miller |
| 4,602,218 A | 7/1986 | Vilmur et al. |
| 4,607,234 A | 8/1986 | Nordholt et al. |
| 4,613,990 A | 9/1986 | Halpern |
| 4,654,882 A | 3/1987 | Ikeda |
| 4,661,993 A | 4/1987 | Leland et al. |
| 4,709,403 A | 11/1987 | Kikuchi |
| 4,723,304 A | 2/1988 | Maeda |
| 4,727,337 A | 2/1988 | Jason |
| 4,740,964 A | 4/1988 | Stalick |
| 4,797,632 A | 1/1989 | Guery |
| 4,816,772 A | 3/1989 | Klotz |
| 4,870,698 A | 9/1989 | Katsuyama et al. |
| 4,893,093 A | 1/1990 | Cronauer et al. |
| 4,901,032 A | 2/1990 | Komiak |
| 4,901,307 A | 2/1990 | Gilhousen et al. |
| 5,029,298 A | 7/1991 | Chiba et al. |
| 5,083,096 A | 1/1992 | Miyazaki |
| 5,099,204 A | 3/1992 | Wheatley, III |
| 5,107,225 A | 4/1992 | Wheatley, III |
| 5,128,627 A | 7/1992 | Wendt |
| 5,132,634 A | 7/1992 | Suarez |
| 5,136,300 A | 8/1992 | Clarke et al. |
| 5,146,180 A | 9/1992 | Hyakutake |
| 5,152,004 A | 9/1992 | Vaisanen et al. |
| 5,163,181 A | 11/1992 | Koontz |
| 5,175,871 A | 12/1992 | Kunkel |
| 5,192,919 A | 3/1993 | Wieczorek |
| 5,251,330 A | 10/1993 | Chiba et al. |
| 5,256,987 A | 10/1993 | Kibayashi et al. |
| 5,285,169 A | 2/1994 | Theus |
| 5,287,543 A | 2/1994 | Wolkstein |
| 5,329,548 A | 7/1994 | Borg |
| 5,339,046 A | 8/1994 | Kornfeld et al. |
| 5,420,537 A | 5/1995 | Weedon et al. |
| 5,438,684 A | 8/1995 | Schwent et al. |
| 5,457,427 A | 10/1995 | Wong et al. |
| 5,487,185 A | 1/1996 | Halonen |
| 5,530,923 A | 6/1996 | Heinonen et al. |
| 5,541,554 A | 7/1996 | Stengel et al. |
| 5,542,096 A | 7/1996 | Cygan et al. |
| 5,548,246 A | 8/1996 | Yamamoto et al. |
| 5,568,086 A | 10/1996 | Schuss et al. |
| 5,608,353 A | 3/1997 | Pratt |
| 5,661,434 A | 8/1997 | Brozovich et al. |
| 5,678,208 A | 10/1997 | Kowalewski et al. |
| 5,872,481 A | 2/1999 | Sevic et al. |
| 5,909,643 A | 6/1999 | Aihara |
| 5,926,069 A * | 7/1999 | Ko et al. .................. 330/302 |
| 5,974,041 A | 10/1999 | Kornfeld et al. |
| 6,069,526 A | 5/2000 | Ballantyne |
| 6,118,989 A | 9/2000 | Abe et al. |
| 6,271,722 B1 | 8/2001 | Ballantyne |
| 6,603,352 B2 | 8/2003 | Wight |
| 6,670,848 B2 | 12/2003 | Fanous et al. |
| 6,731,166 B1 | 5/2004 | Sabouri et al. |
| 6,822,321 B2 * | 11/2004 | Crescenzi, Jr. .............. 257/691 |
| 6,996,379 B2 | 2/2006 | Khorram |
| 7,009,455 B2 * | 3/2006 | Toncich et al. .............. 330/305 |
| 7,157,965 B1 | 1/2007 | Kim |
| 7,345,534 B2 * | 3/2008 | Grebennikov .................. 330/51 |
| 7,385,445 B2 * | 6/2008 | Wright ............................ 330/51 |
| 7,417,508 B1 * | 8/2008 | Quaglietta ..................... 330/302 |
| 7,425,873 B2 * | 9/2008 | Yamamoto .................... 330/302 |
| 7,436,257 B2 * | 10/2008 | Park et al. ........................ 330/51 |
| 7,479,827 B2 * | 1/2009 | Hau et al. ........................ 330/51 |
| 7,482,868 B2 * | 1/2009 | Hageman et al. ............. 330/133 |
| 7,482,878 B2 * | 1/2009 | Nakai ............................. 330/298 |
| 7,501,897 B2 * | 3/2009 | Mori et al. ..................... 330/302 |
| 7,508,269 B2 * | 3/2009 | Fukuda et al. ................. 330/302 |
| 7,541,874 B2 * | 6/2009 | Maeda et al. .................. 330/302 |
| 7,554,394 B2 * | 6/2009 | Maemura ................... 330/124 R |
| 7,800,448 B2 * | 9/2010 | Blednov ........................ 330/295 |
| 7,944,291 B2 | 5/2011 | Jung et al. |
| 8,102,205 B2 | 1/2012 | Pletcher et al. |
| 8,149,050 B2 | 4/2012 | Cabanillas |
| 2002/0140503 A1 * | 10/2002 | Fujiwara et al. ................ 330/51 |
| 2004/0178853 A1 * | 9/2004 | Barak ............................ 330/302 |
| 2004/0222849 A1 | 11/2004 | Doi |
| 2005/0179499 A1 | 8/2005 | Fenk |
| 2007/0018720 A1 | 1/2007 | Wright |
| 2007/0021088 A1 | 1/2007 | Sheng-Fuh et al. |
| 2007/0194853 A1 * | 8/2007 | Mori et al. .................... 330/302 |
| 2007/0222523 A1 | 9/2007 | Arell |
| 2008/0007327 A1 | 1/2008 | Kim et al. |
| 2011/0316637 A1 | 12/2011 | Pletcher et al. |

FOREIGN PATENT DOCUMENTS

| | | |
|---|---|---|
| EP | 0851576 A2 | 7/1998 |
| EP | 1612932 A1 | 1/2006 |
| JP | 5720693 | 2/1982 |
| JP | 5997213 | 6/1984 |
| WO | WO2009020325 A2 | 2/2009 |

OTHER PUBLICATIONS

D. Hay, et al., "The Exploratory Development of a High Power S-Band Solid State Radar Transmitter", IEEE International Radar Conference, May 7, 1990, pp. 135-140.

Rofougaran, M., et al., "A 900 MHz CMOS RF Power Amplifier with Programmable Output Power", Integrated Circuits & Systems Laboratory, 1994 Symposium on VLSI Circuits, 1994. Digest of Technical Papers., pp. 133-134.

\* cited by examiner

MULTI-STAGE IMPEDANCE MATCHING

CLAIM OF PRIORITY UNDER 35 U.S.C. §119

The present application for patent claims priority to Provisional U.S. Application Ser. No. 61/231,242, entitled "TWO-STAGE MULTI-BAND MULTI-MODE POWER AMPLIFIER FOR HIGH-BAND CELLULAR PATH," filed Aug. 4, 2009, and Provisional U.S. Application Ser. No. 61/230,976, entitled "TWO-STAGE MULTI-BAND MULTI-MODE POWER AMPLIFIER FOR HIGH/LOW-BAND CELLULAR PATHS," filed Aug. 3, 2009, both assigned to the assignee hereof, and expressly incorporated herein by reference.

BACKGROUND

I. Field

The present disclosure relates generally to electronics, and more specifically to techniques for performing impedance matching.

II. Background

A wireless communication device typically includes a transmitter and a receiver to support bi-directional communication. The transmitter may include a power amplifier (PA) to amplify an input radio frequency (RF) signal and provide high output power for transmission via an antenna. The receiver may include a low noise amplifier (LNA) to amplify a received RF signal from the antenna. The power amplifier and the LNA may each have input impedance matching and output impedance matching to provide good performance. It may be desirable perform impedance matching in an efficient manner.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for performing impedance matching with multiple stages are described herein. The techniques may be used for various types of amplifiers and other active circuits. The techniques may also be used for various electronic devices such as wireless communication devices, cellular phones, personal digital assistants (PDAs), handheld devices, wireless modems, laptop computers, cordless phones, broadcast receivers, Bluetooth devices, consumer electronic devices, etc. For clarity, impedance matching for amplifiers in a wireless device, which may be a cellular phone or some other device, is described below.

Figure 1:
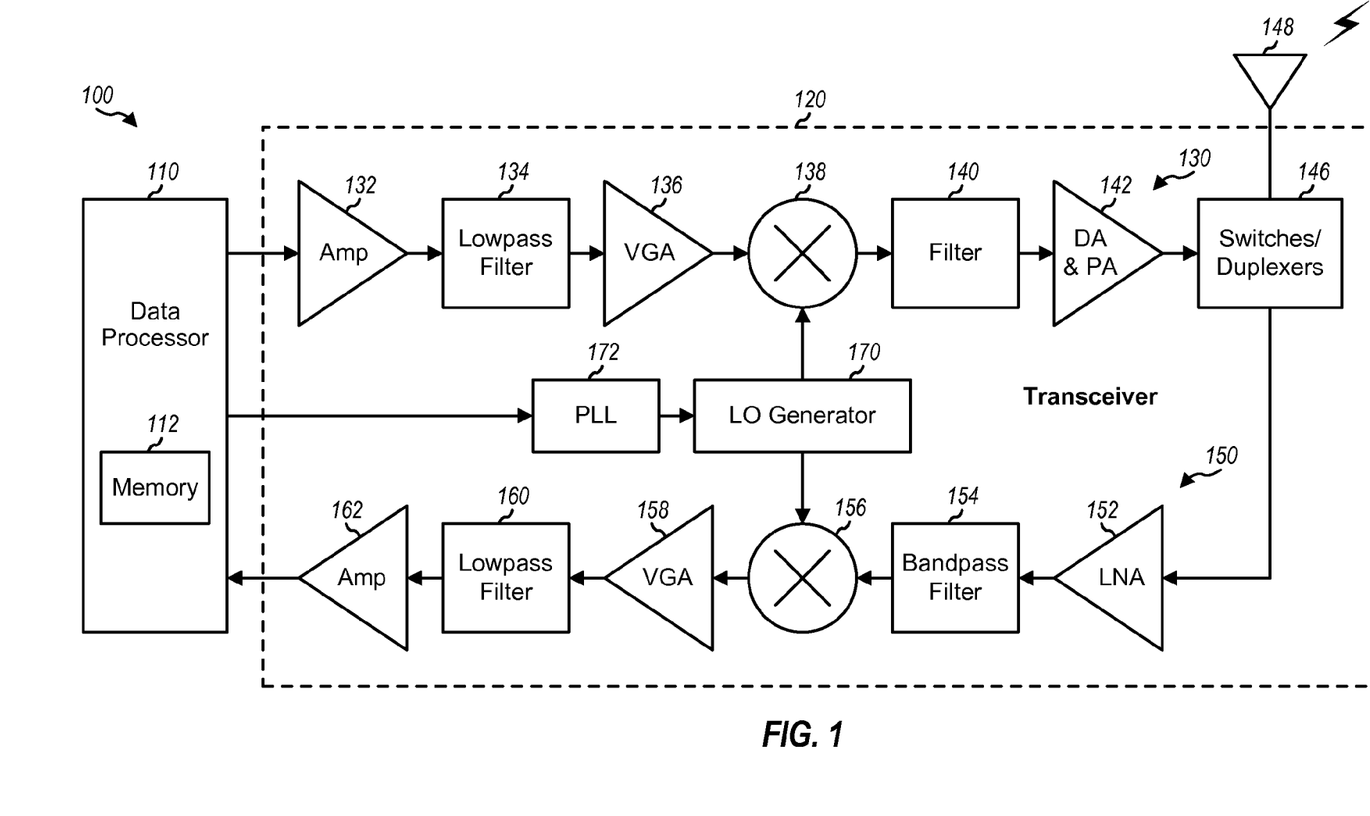
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a variable gain amplifier (VGA) 136, and upconverted from baseband to RF by an upconverter 138. The upconverted signal is filtered by a filter 140 to remove images caused by the frequency upconversion, further amplified by a driver amplifier (DA) and/or a power amplifier (PA) 142, routed through switches/duplexers 146, and transmitted via an antenna 148.

In the receive path, antenna 148 receives signals from base stations and other transmitter stations and provides a received RF signal, which is routed through switches/duplexers 146 and provided to receiver 150. Within receiver 150, the received RF signal is amplified by an LNA 152, filtered by a bandpass filter 154, and downconverted from RF to baseband by a downconverter 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to upconverter 138 and downconverter 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc. For example, amplifier 132 through power amplifier 142 in transmitter 130 may be implemented on an RFIC.

Data processor 110 may perform various functions for wireless device 100, e.g., processing for data being transmitted or received. A memory 112 may store program codes and data for data processor 110. Data processor 110 may be implemented on one or more application specific integrated circuits (ASICs) and/or other ICs.

As shown in FIG. 1, a transmitter and a receiver may include various amplifiers. Each amplifier at RF may have input impedance matching and output impedance matching, which are not shown in FIG. 1 for simplicity.

Figure 2:
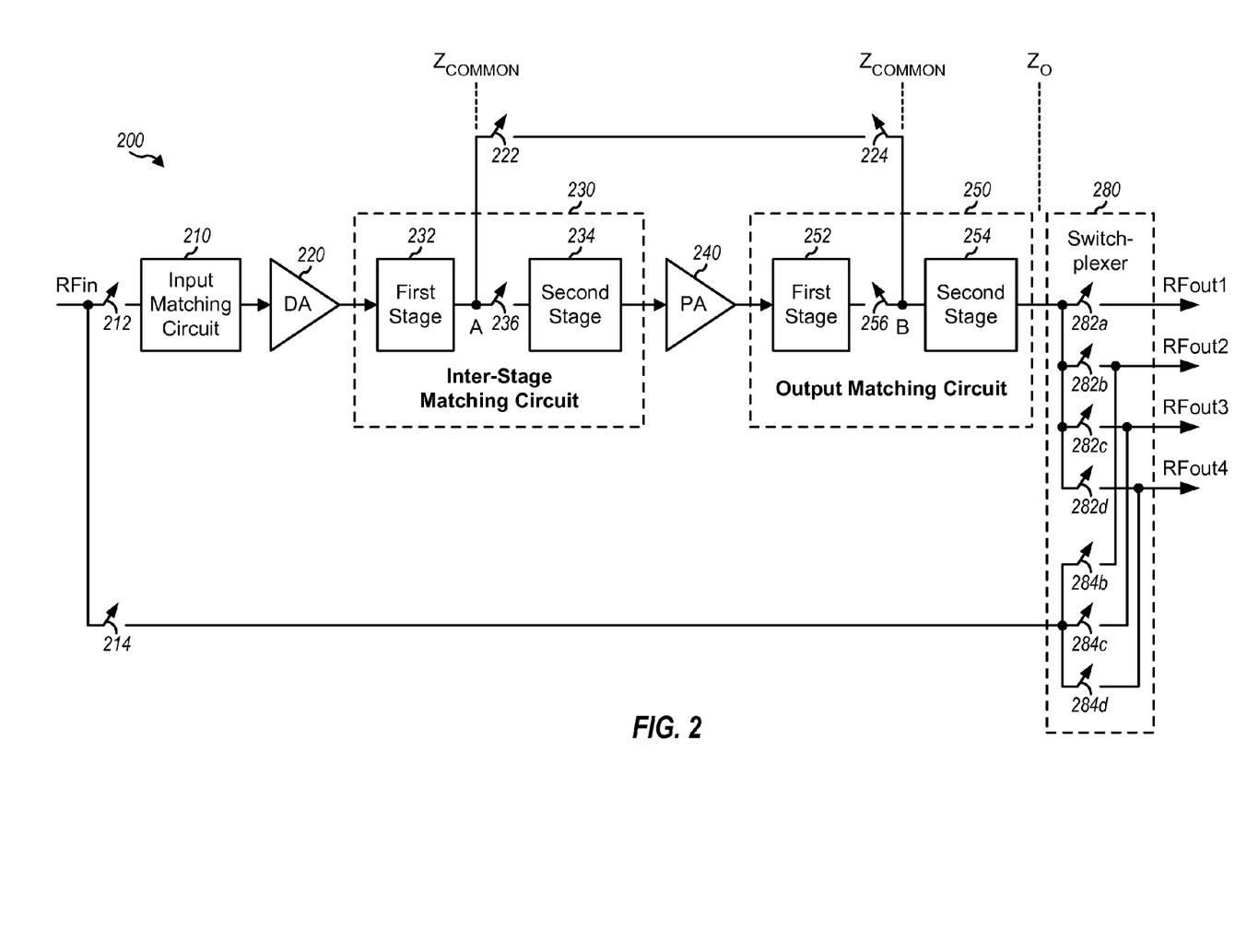
FIGS. 2, 3 and 4 show three exemplary designs of a PA module.

FIG. 2 shows a block diagram of an exemplary design of a PA module 200, which may be used for driver and power amplifiers 142 and part of switches/duplexers 146 in FIG. 1. Within PA module 200, a switch 212 has one terminal receiving an input RF signal (RFin) and the other terminal coupled to the input of an input matching circuit 210. A driver amplifier 220 has its input coupled to the output of matching circuit 210 and its output coupled to the input of an inter-stage matching circuit 230. A power amplifier 240 has its input coupled to the output of matching circuit 230 and its output coupled to the input of an output matching circuit 250. Matching circuit 250 provides an output RF signal (RFout) to a switchplexer 280.

In the exemplary design shown in FIG. 2, matching circuit 230 includes (i) a first stage 232 coupled between the input of matching circuit 230 and node A and (ii) a second stage 234 coupled in series with a switch 236, with the combination being coupled between node A and the output of matching circuit 230. Matching circuit 250 includes (i) a first stage 252 coupled in series with a switch 256, with the combination being coupled between the input of matching circuit 250 and node B and (ii) a second stage 254 coupled between node B and the output of matching circuit 250. In the exemplary design shown in FIG. 2, two switches 222 and 224 are coupled in series and between nodes A and B. The use of two switches 222 and 224 allows one switch to be implemented close to each of nodes A and B, which may improve performance. In another exemplary design, a single switch may be coupled between nodes A and B.

Within switchplexer 280, switches 282a, 282b, 282c and 282d have their left terminals coupled to the output of matching circuit 250 and their right terminals providing four RF outputs RFout1, RFout2, RFout3 and RFout4, respectively. In an exemplary design, RFout1 may be for Global System for Mobile Communications (GSM) and may be coupled to antenna 148 (not shown in FIG. 2). RFout2 may be for Code Division Multiple Access (CDMA) for frequency band 1, RFout3 may be for CDMA for frequency band 2, and RFout4 may be for CDMA for frequency band 3. RFout2, RFout3 and RFout4 may be coupled to three duplexers for bands 1, 2 and 3, respectively (not shown in FIG. 2). CDMA may cover Wideband CDMA (WCDMA), cdma2000, etc. In an exemplary design, the three frequency bands may cover a frequency range of 1710 to 1980, e.g., UMTS bands I, II and III. In general, any number of RF outputs may be provided for any number of radio technologies and any number of frequency bands. The supported frequency bands may cover any range of frequencies.

A switch 214 has one terminal receiving the RFin signal and the other terminal coupled to the left terminals of switches 284b, 284c and 284d. The right terminals of switches 284b, 284c and 284d are coupled to the right terminals of switches 282b, 282c and 282d, respectively.

Driver amplifier 220 may be selected/enabled to provide signal amplification or may be bypassed/disabled. Power amplifier 240 may also be selected to provide power amplification or may be bypassed. Matching circuit 210 may provide input impedance matching for driver amplifier 220. Matching circuit 230 may provide output impedance matching for driver amplifier 220 and input impedance matching for power amplifier 240. Matching circuit 250 may provide output impedance matching for power amplifier 240. Matching circuit 250 may have a relatively low target input impedance (e.g., 4 to 8 Ohms) and a moderate target output impedance $Z_O$ (e.g., 50 Ohms). Matching circuit 230 may have a moderate input impedance (e.g., around 25 Ohms) and the target output impedance (e.g., 50 Ohms). Matching circuits 210, 230 and 250 may also provide filtering to attenuate undesired signal components, e.g., at harmonic frequencies.

In the exemplary design shown in FIG. 2, matching circuits 230 and 250 each includes two stages. In an exemplary design that is not shown in FIG. 2, nodes A and B within matching circuits 230 and 250 may have different impedances. In this exemplary design, the impedance at each node may be selected to provide good impedance matching (e.g., low insertion loss) across all frequency bands of interest. In another exemplary design that is shown in FIG. 2, nodes A and B may have a common impedance of $Z_{COMMON}$. $Z_{COMMON}$ may be selected to provide low inband insertion loss and good out-of-band attenuation for all frequency bands of interest. $Z_{COMMON}$ may be within a range of 10 to 50 Ohms (e.g., within a range of 14 to 25 Ohms) when $Z_O$ is 50 Ohms.

The use of a common impedance for nodes A and B may result in good impedance matching regardless of whether power amplifier 240 is selected or bypassed. When power amplifier 240 is selected, switches 236 and 256 are closed, and switches 222 and 224 are opened. Matching circuits 230 and 250 may each operate as designed. When power amplifier 240 is bypassed, switches 236 and 256 are opened, and switches 222 and 224 are closed. Second stage 234 and first stage 252 are disconnected, and the output impedance matching for driver amplifier 220 is provided by first stage 232 and second stage 254. The common impedance at nodes A and B may result in better impedance matching when power amplifier 240 is bypassed.

The use of multiple (e.g., two) stages for each of matching circuits 230 and 250 may provide certain advantages. First, multiple stages may be able to provide broadband impedance matching with low inband insertion loss for multiple frequency bands, which may be desirable. Second, switches 222 and 224 may be placed at medium impedance nodes. Switches 222 and 224 may have some on impedance, and the medium impedance at nodes A and B may result in lower insertion loss due to these switches. Third, the multiple stages may be able to provide wider bandwidth and/or more rejection of harmonics. Other advantages may also be obtained with the use of multiple stages for impedance matching.

PA module 200 may support a number of operating modes. Each operating mode may be associated with a different signal path for the RFin signal via zero or more amplifiers. One operating mode may be selected at any given moment. The signal path for the selected operating mode may be obtained by properly controlling the switches within PA module 200. Table 1 lists three operating modes that may be supported by PA module 200. Table 1 also provides the selected amplifiers and the switch settings for each operating mode. Additional operating modes may also be supported with more switches. For all operating modes, one of the switches in switchplexer 280 may be closed to provide either the RFin signal or the RFout signal from matching circuit 250 as the desired RF output.

TABLE 1

Operating Modes for PA Module 200

| Mode | Amplifier Settings | Switch Settings |
| --- | --- | --- |
| High Power | Driver amplifier 220 and power amplifier 240 are both selected | Switches 212, 236 and 256 are closed; switches 214, 222 and 224 are opened |
| Medium Power | Driver amplifier 220 is selected; power amplifier 240 is bypassed | Switches 212, 222 and 224 are closed; switches 214, 236 and 256 are opened |
| Full Bypass | Driver amplifier 220 and power amplifier 240 are both bypassed | Switch 214 is closed; switches 212, 236, 222, 256 and 224 are opened |

Figure 3:
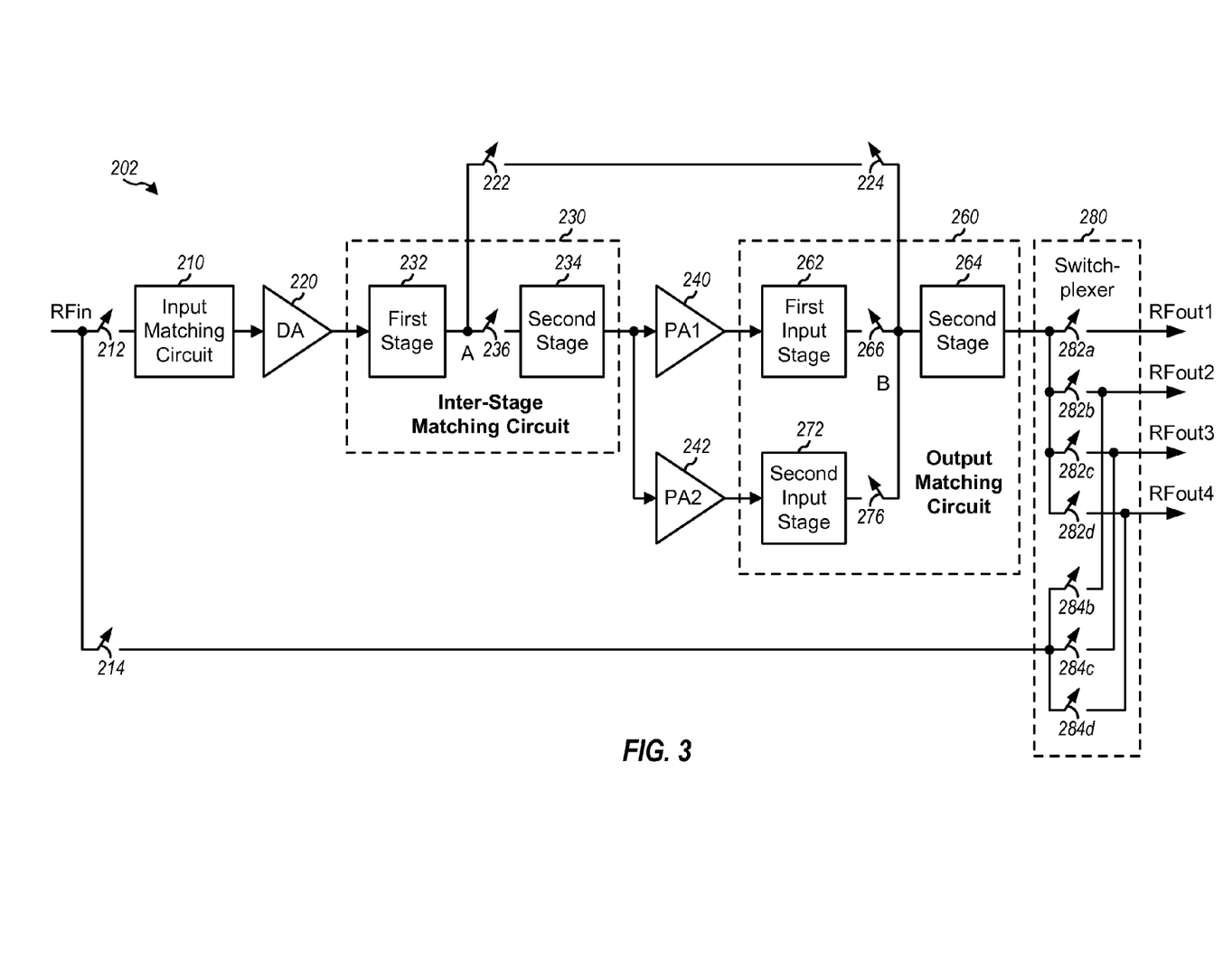

FIG. 3 shows a block diagram of an exemplary design of a PA module 202, which may also be used for driver and power amplifiers 142 and part of switches/duplexers 146 in FIG. 1. PA module 202 includes all circuit components in PA module 200 in FIG. 2, except for output matching circuit 250. PA module 202 further includes a second power amplifier 242 and an output matching circuit 260 in place of output matching circuit 250. Power amplifier 242 has its input coupled to the input of power amplifier 240. Matching circuit 260 includes (i) a first input stage 262 coupled in series with switch 266, with the combination being coupled between the output of power amplifier 240 and node B, (ii) a second input stage 272 coupled in series with a switch 276, with the combination being coupled between the output of power amplifier 242 and node B, and (iii) a second stage 264 coupled between node B and the output of matching circuit 260.

FIG. 3 shows two power amplifiers 240 and 242 being coupled in parallel. Power amplifiers 240 and 242 may also be replaced with a single power amplifier having two output stages, which may be coupled to input stages 262 and 272, respectively.

PA module 202 may support all of the operating modes shown in Table 1. PA module 202 may further support additional operating modes. For example, PA module 202 may support (i) an operating mode in which driver amplifier 220 and power amplifiers 240 and 242 are all selected, (ii) an operating mode in which driver amplifier 220 and power amplifier 242 are selected and power amplifier 240 is bypassed, and/or (iii) other operating modes.

Figure 4:
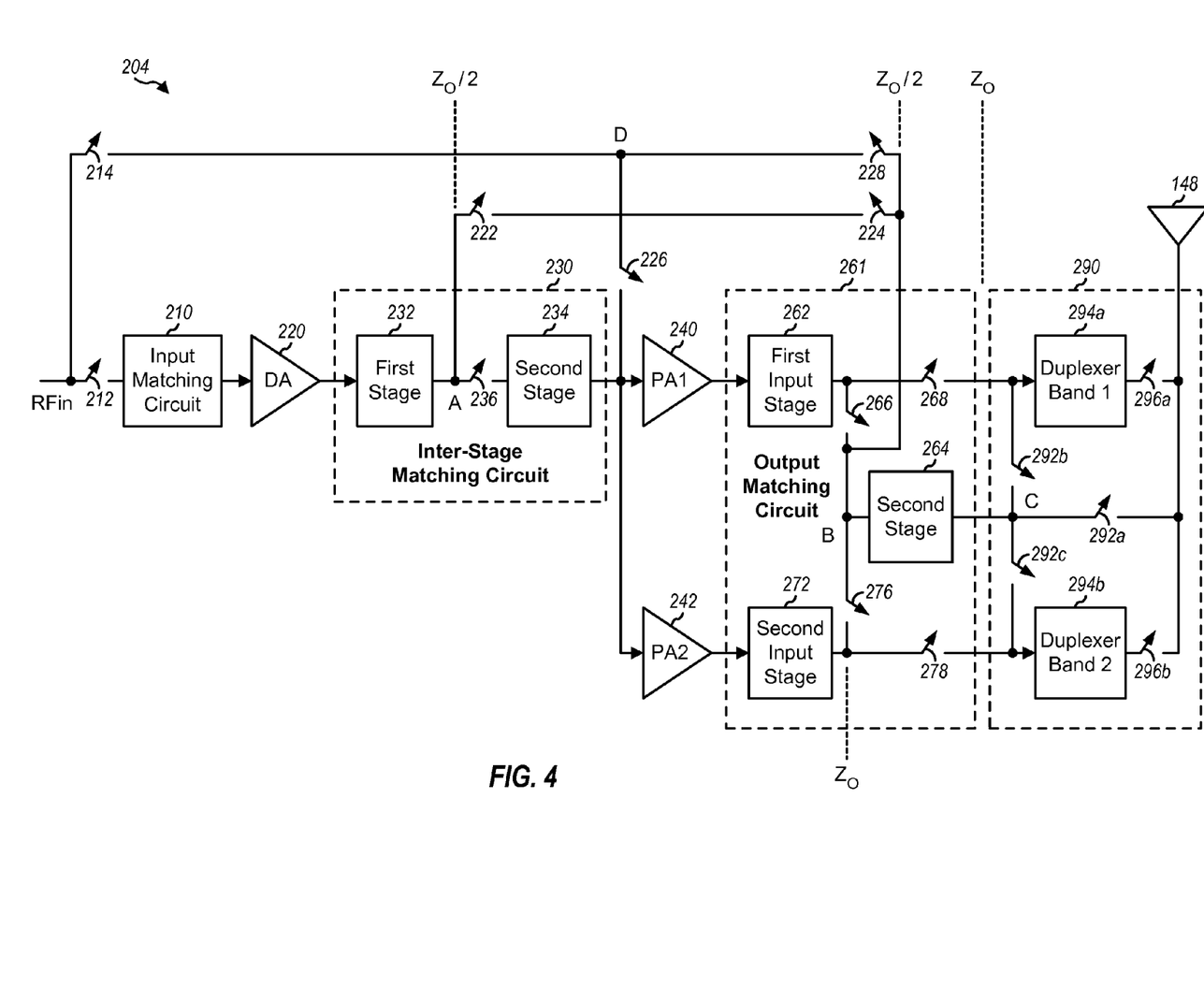

FIG. 4 shows a block diagram of an exemplary design of a PA module 204, which may also be used for driver and power amplifiers 142 and part of switches/duplexers 146 in FIG. 1. PA module 204 includes all circuit components in PA module 202 in FIG. 3, except for output matching circuit 260 and switchplexer 280. PA module 204 further includes (i) an output matching circuit 261 in place of output matching circuit 260 and (ii) switches/duplexers 290 in place of switchplexer 280.

Matching circuit 261 includes first input stage 262, second input stage 272, second stage 264, and switches 266 and 276, which are coupled as described above for matching circuit 260 in FIG. 3. Matching circuit 261 further includes switches 268 and 278 that provide two additional output RF signals as well as the output RF signal from second stage 264. Switch 268 has one terminal coupled to the output of first input stage 262 and the other terminal coupled to a transmit port of a duplexer 294a for band 1 within switches/duplexers 290. Switch 278 has one terminal coupled to the output of second input stage 272 and the other terminal coupled to a transmit port of a duplexer 294b for band 2 within switches/duplexers 290. The output of second stage 264 is coupled to node C in switches/duplexers 290.

Within switches/duplexers 290, a switch 292a is coupled between node C and antenna 148. A switch 292b is coupled between node C and the transmit port of duplexer 294a. A switch 292c is coupled between node C and the transmit port of duplexer 294b. The receive ports of duplexers 294a and 294b may be coupled to receivers (not shown in FIG. 4). A switch 296a has one terminal coupled to the output of duplexer 294a and the other terminal coupled to antenna 148. A switch 296b has one terminal coupled to the output of duplexer 294b and the other terminal coupled to antenna 148. PA module 204 may support a number of operating modes, and some operating modes are described below.

Figure 5A:
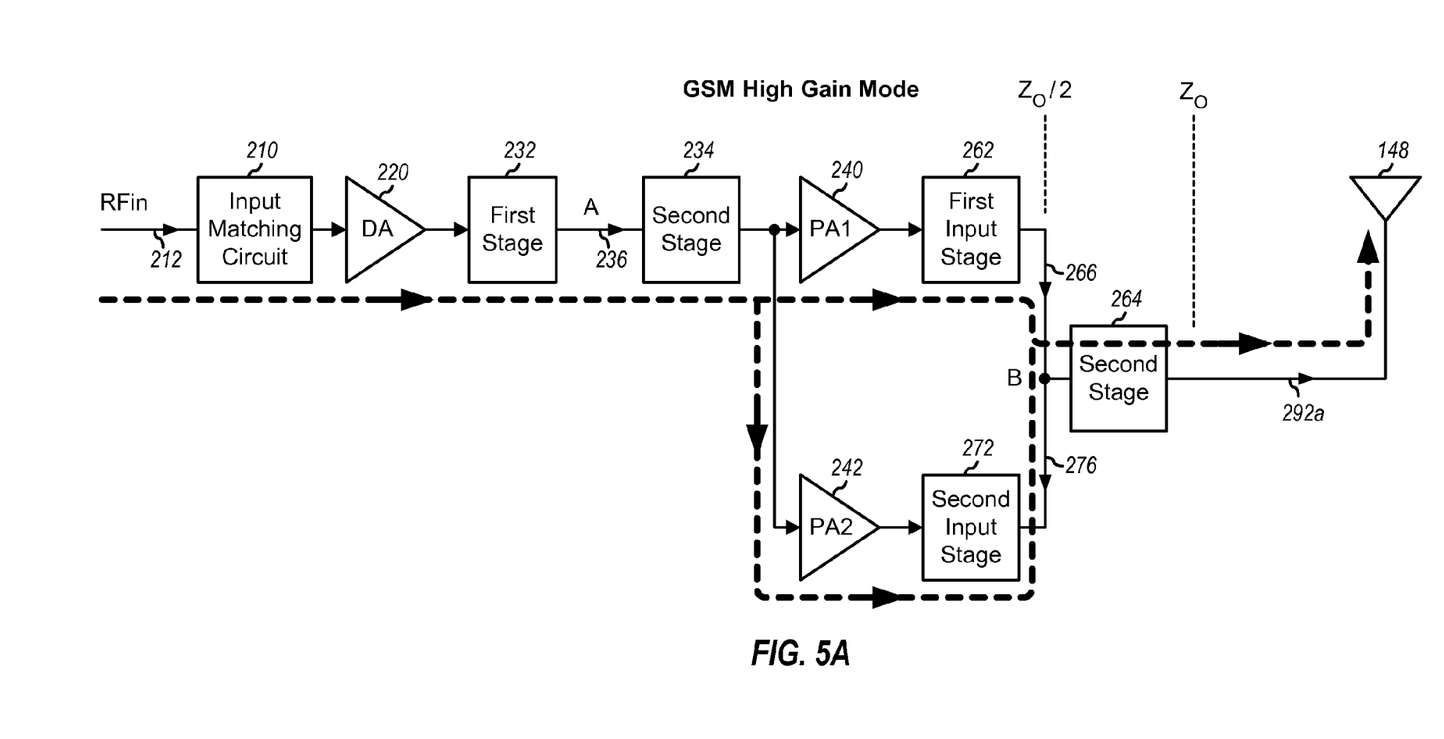
FIGS. 5A, 5B and 5C show three operating modes of the PA module in FIG. 4.

FIG. 5A shows a GSM high gain mode for PA module 204 in FIG. 4. In this operating mode, driver amplifier 220 and power amplifiers 240 and 242 are all selected. The RFin signal is passed through switch 212, matching circuit 210, driver amplifier 220, matching circuit 230, and provided to both power amplifiers 240 and 242. The output signals from power amplifiers 240 and 242 are routed through first input stage 262 and second input stage 272, respectively, combined at node B, and further routed through second stage 264 and switch 292a to antenna 148. Power amplifiers 240 and 242 may be able to provide a high maximum power level (e.g., +33 dBm) for GSM.

Figure 5B:
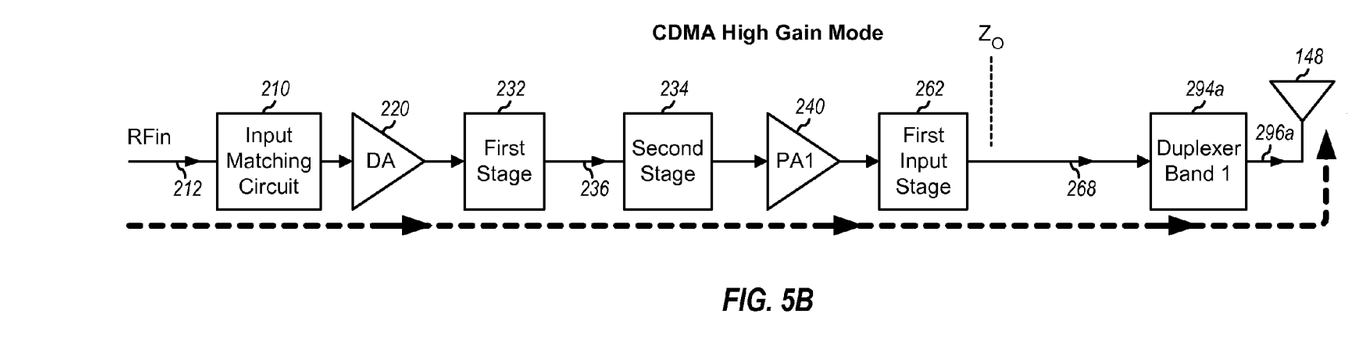

FIG. 5B shows a CDMA high gain mode for band 1 for PA module 204 in FIG. 4. In this operating mode, driver amplifier 220 and power amplifier 240 are selected, and power amplifier 242 is bypassed. The RFin signal is passed through switch 212, matching circuit 210, driver amplifier 220, matching circuit 230, and provided to power amplifier 240. The output signal from power amplifier 240 is routed through first input stage 262, switch 268, duplexer 294a, and switch 296a to antenna 148. Power amplifier 240 alone may be able to provide a high maximum power level (e.g., +27 dBm) for CDMA band 1.

Referring back to FIG. 4, for a CDMA high gain mode for band 2, driver amplifier 220 and power amplifier 242 are selected, and power amplifier 240 is bypassed. The output signal from power amplifier 242 is routed through second input stage 272, switch 278, duplexer 294b, and switch 296b to antenna 148. Power amplifier 242 alone may be able to provide the high maximum power level (e.g., +27 dBm) for CDMA band 2.

Figure 5C:
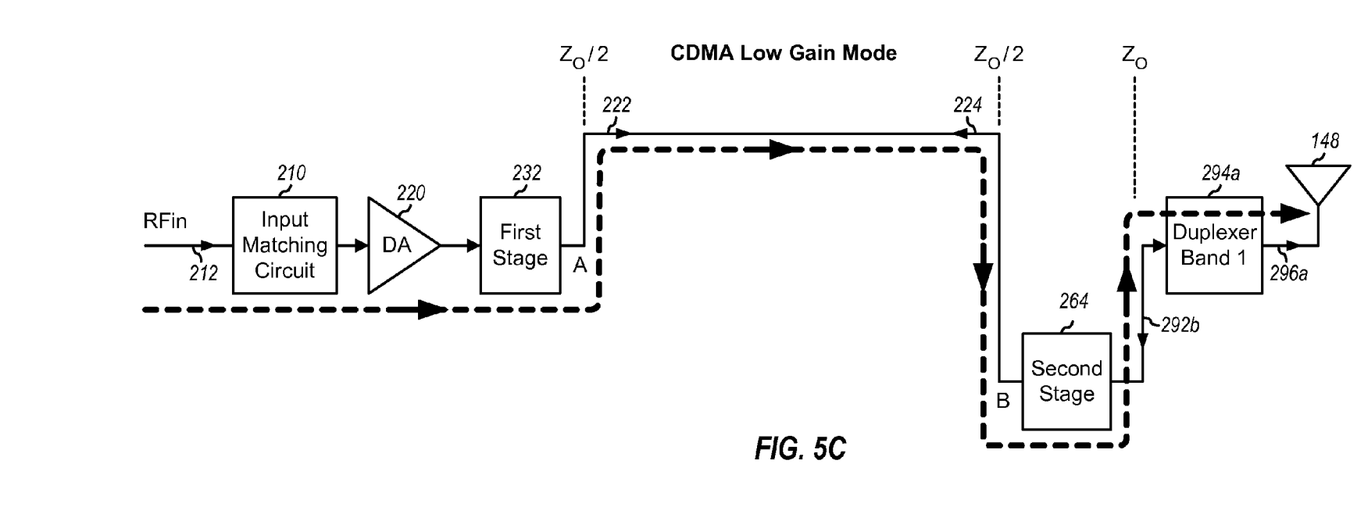

FIG. 5C shows a CDMA low gain mode for band 1. In this operating mode, driver amplifier 220 is selected, and power amplifiers 240 and 242 are bypassed. The RFin signal is passed through switch 212, matching circuit 210, driver amplifier 220, first stage 232 of matching circuit 230, switches 222 and 224, second stage 264 of matching circuit 261, switch 292b, duplexer 294a, and switch 296a to antenna 148. Driver amplifier 220 alone may be able to provide the desired output power for the output RF signal in this operating mode.

Other operating modes may also be supported for GSM and CDMA. Each operating mode may be associated with a different signal path for the RFin signal via zero or more amplifiers. The signal path for the selected operating mode may be obtained by properly controlling the switches within PA module 204.

Referring back to FIG. 4, first input stage 262 and second input stage 272 within matching circuit 261 may each be designed to have an output impedance of $Z_O$. The output of first input stage 262 may then be provided directly to duplexer 294a in the CDMA high gain mode for band 1, as shown in FIG. 5B. Similarly, the output of second input stage 272 may be provided directly to duplexer 294b in the CDMA high gain mode for band 2. When both power amplifiers 240 and 242 are selected, as shown in FIG. 5A, the impedance at node B may be $Z_O/2$. Second stage 264 may be designed to have an input impedance of $Z_O/2$ and an output impedance of $Z_O$.

Matching circuit 230 may be designed to have an impedance of $Z_O/2$ at node A, as shown in FIG. 4. This may then result in a common impedance of $Z_O/2$ at nodes A and B. Power amplifiers 240 and 242 may be bypassed, and the output of first stage 232 in matching circuit 230 may be coupled to second stage 264 in matching circuit 261 via switches 222 and 224, as shown in FIG. 5C. Improved performance may be obtained by having a common impedance of $Z_O/2$ at nodes A and B.

In the exemplary design shown in FIG. 4, PA module 204 further includes switches 226 and 228 to implement several bypass modes. Switch 214 is coupled between the RFin input and node D. Switch 226 is coupled between node D and the inputs of power amplifiers 240 and 242. Switch 228 is coupled between node D and node B. A full bypass mode (with switches 214 and 228 closed) may bypass the entire transmit chain except for second stage 264 in matching circuit 261. Second stage 264 may provide filtering for the RFin signal prior to being routed to antenna 148 via switch 292a, duplexer 294a, or duplexer 294b. Second stage 264 may further provide output impedance matching in the full bypass mode. In another exemplary design, the full bypass mode may bypass the entire transmit chain, and switch 228 may be coupled to node C instead of node B. An input bypass mode (with switch 214 and 226 closed) may bypass matching circuit 210, driver amplifier 220, and matching circuit 230. Other bypass modes may also be implemented with switches 214, 222, 224, 226 and 228.

In the exemplary designs shown in FIGS. 2, 3 and 4, switches may be used to route RF signals and support multiple operating modes. The switches may be implemented with metal oxide semiconductor (MOS) transistors, transistors of other types, and/or other circuit components.

Figure 6:
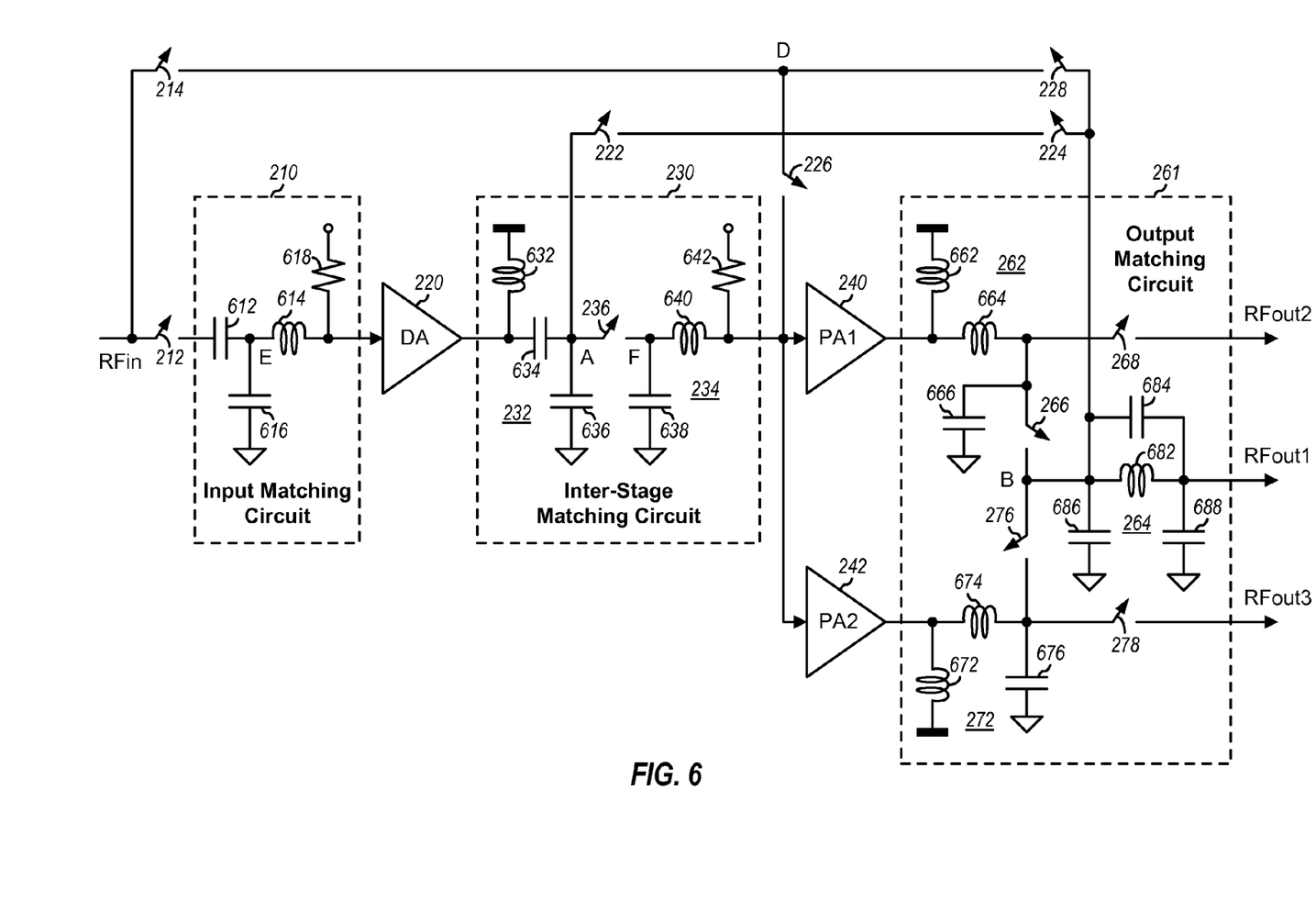
FIG. 6 shows an exemplary design of an input matching circuit, an inter-stage matching circuit, and an output matching circuit within the PA module in FIG. 4.

FIG. 6 shows a schematic diagram of an exemplary design of input matching circuit 210, inter-stage matching circuit 230, and output matching circuit 261 within PA module 204 in FIG. 4. Within input matching circuit 210, a capacitor 612 has one end coupled to switch 212 and the other end coupled to node E. An inductor 614 is coupled between node E and the input of driver amplifier 220. A capacitor 616 is coupled between node E and circuit ground. A resistor 618 is coupled between the input of driver amplifier 220 and a bias voltage.

Within matching circuit 230, first stage 232 is implemented with an inductor 632 and capacitors 634 and 636, which form a highpass network. Second stage 234 is implemented with a capacitor 638, an inductor 640, and a resistor 642, which form a lowpass network. First stage 232 and second stage 234 may also implement other networks. For first stage 232, inductor 632 is coupled between the output of driver amplifier 220 and a power supply. Capacitor 634 is coupled between the output of driver amplifier 220 and node A. Capacitor 636 is coupled between node A and circuit ground. Switch 236 is coupled between node A and node F. For second stage 234, capacitor 638 is coupled between node F and circuit ground. Inductor 640 is coupled between node F and the input of power amplifier 240. Resistor 642 is coupled between the input of power amplifier 240 and a bias voltage.

Within matching circuit 261, first input stage 262 is implemented with inductors 662 and 664 and a capacitor 666, which form a lowpass network. Second input stage 272 is implemented with inductors 672 and 674 and a capacitor 676, which form a lowpass network. Second stage 264 is implemented with inductor 682 and capacitors 684, 686 and 688, which form a lowpass network. All of the stages may implement lowpass networks, as shown in FIG. 6, or other networks. For first input stage 262, inductor 662 is coupled between the output of power amplifier 240 and the power supply. Inductor 664 is coupled between the output of power amplifier 240 and the output of first input stage 262. Capacitor 666 is coupled between the output of first input stage 262 and circuit ground. For second input stage 272, inductor 672 is coupled between the output of power amplifier 242 and the power supply. Inductor 674 is coupled between the output of power amplifier 242 and the output of second input stage 272. Capacitor 676 is coupled between the output of second input stage 272 and circuit ground. For second stage 264, inductor 682 and capacitor 684 are coupled in parallel, and the combination is coupled between node B and the output of second stage 264. Capacitor 686 is coupled between node B and circuit ground. Capacitor 688 is coupled between the output of second stage 264 and circuit ground.

FIG. 6 shows exemplary designs of matching circuits 210, 230 and 261. In general, each matching circuit may be implemented with any number of stages. Each stage may be implemented with a lowpass network, a highpass network, a bandpass network, etc.

For clarity, impedance matching with multiple stages has been described for driver amplifier 220 and power amplifiers 240 and 242 in transmitter 130. Impedance matching with multiple stages may also be used for LNA 152 in receiver 150 and/or for other amplifiers in a transmitter or a receiver.

In an exemplary design, an apparatus may comprise first and second matching circuits and an amplifier coupled to these matching circuits, e.g., as shown in FIG. 2. The amplifier may be a power amplifier, a driver amplifier, an LNA, or some other active circuit such as a mixer. The first matching circuit may comprise multiple stages coupled in series and may provide input impedance matching for the amplifier. The second matching circuit may also comprise multiple stages coupled in series and may provide output impedance matching for the amplifier.

In an exemplary design, the first matching circuit may comprise first and second stages coupled to a first node, e.g., node A in FIG. 2. The second matching circuit may comprise first and second stages coupled to a second node, e.g., node B in FIG. 2. The apparatus may further comprise at least one switch coupled between the first and second nodes and operable to bypass or select the amplifier. The first node may have a first impedance. The second node may have a second impedance matching the first impedance (as shown in FIG. 2) or different from the first impedance.

In an exemplary design, the apparatus may further comprise a second amplifier coupled in parallel with the amplifier and further to the first and second matching circuits, e.g., as shown in FIG. 4. The second matching circuit may comprise a first input stage coupled to the amplifier, a second input stage coupled to the second amplifier, and a second stage coupled to the first and second input stages via switches. The first input stage may provide a first output RF signal in a first mode. The second input stage may provide a second output RF signal in a second mode. The second stage may provide a third output RF signal in a third mode. The first and second input stages may each have a target output impedance (e.g., $Z_O$) when they are not coupled to the second stage. The second stage may have the target output impedance (e.g., $Z_O$) when it is coupled to the first and second input stages. At least one switch may be coupled between the first node (e.g., node A) and the second stage of the second matching circuit. The first stage (e.g., first stage 232) of the first matching circuit may have an output impedance of one half the target output impedance (e.g., $Z_O/2$). The second stage (e.g., second stage 264) of the second matching circuit may have an input impedance of one half the target output impedance (e.g., $Z_O/2$).

In an exemplary design, the amplifier may comprise a power amplifier. The apparatus may further comprise a driver amplifier coupled to the first matching circuit and a third matching circuit (e.g., matching circuit 210) coupled to the driver amplifier. The first matching circuit may provide output impedance matching for the driver amplifier. The third matching circuit may provide input impedance matching for the driver amplifier. The apparatus may further comprise at least one switch (e.g., e.g., switches 214 and 228) to bypass or select the driver amplifier and the power amplifier. The at least one switch may be coupled between the third matching circuit and a node (e.g., node B) between two stages in the second matching circuit. At least one stage (e.g., second stage 264) in the second matching circuit may provide filtering when the driver amplifier and the power amplifier are bypassed.

In an exemplary design, the first matching circuit may comprise (i) a highpass network for the first stage and (ii) a lowpass network for the second stage, e.g., as shown in FIG. 6. In an exemplary design, the second matching circuit may comprise (i) a lowpass network for the first stage or for each of the first and second input stages and (ii) a lowpass network for the second stage, e.g., as also shown in FIG. 6. In general, each stage may comprise a lowpass network, a highpass network, a bandpass network, etc. The first and second matching circuits may provide impedance matching for multiple frequency bands.

In an exemplary design, a wireless communication device may comprise first and second matching circuits, a power amplifier, and at least one switch, e.g., as shown in FIG. 2. The first matching circuit (e.g., matching circuit 230) may comprise multiple stages coupled in series and to a first node (e.g., node A). The second matching circuit (e.g., matching circuit 250 or 261) may comprise multiple stages coupled in series and to a second node (e.g., node B). The power amplifier (e.g., power amplifier 240) may be coupled to the first and second matching circuits. The first matching circuit may provide input impedance matching for the power amplifier. The second matching circuit may provide output impedance matching for the power amplifier. The at least one switch (e.g., switches 222 and 224) may be coupled between the first and second nodes and may bypass or select the power amplifier. In an exemplary design, the first node may have a first impedance, and the second node may have a second impedance matching the first impedance.

In an exemplary design, the wireless device may further comprise a second power amplifier (e.g., power amplifier 242) coupled in parallel with the power amplifier and further to the first and second matching circuits, e.g., as shown in FIG. 4. The second matching circuit may comprise first and second input stages and a second stage. The first input stage (e.g., stage 262) may be coupled to the power amplifier and may provide a first output RF signal in a first mode. The second input stage (e.g., stage 272) may be coupled to the second power amplifier and may provide a second output RF signal in a second mode. The second stage (e.g., stage 264) may be coupled to the first and second input stages via switches (e.g., switches 266 and 276) and may provide a third output RF signal in a third mode.

Figure 7:
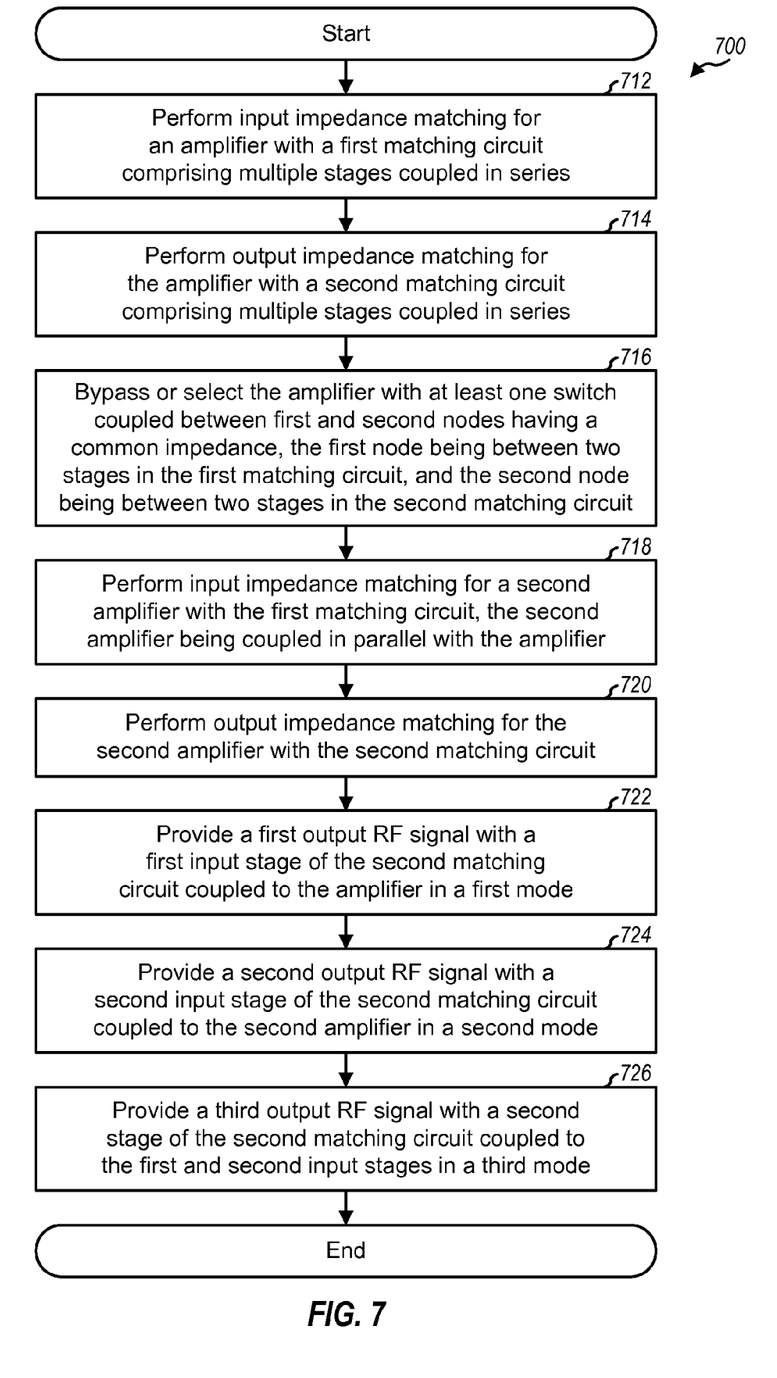
FIG. 7 shows a process for performing impedance matching.

FIG. 7 shows an exemplary design of a process 700 for performing impedance matching. Input impedance matching for an amplifier may be performed with a first matching circuit comprising multiple stages coupled in series (block 712). Output impedance matching for the amplifier may be performed with a second matching circuit comprising multiple stages coupled in series (block 714). The amplifier may be bypassed or selected with at least one switch coupled between (i) a first node between two stages in the first matching circuit and (ii) a second node between two stages in the second matching circuit (block 716). The first and second nodes may have a common impedance.

In an exemplary design, input impedance matching for a second amplifier may be performed with the first matching circuit (block 718). The second amplifier may be coupled in parallel with the amplifier. Output impedance matching for the second amplifier may be performed with the second matching circuit (block 720). A first output RF signal may be provided with a first input stage of the second matching circuit, which is coupled to the amplifier, in a first mode (block 722). A second output RF signal may be provided with a second input stage of the second matching circuit, which is coupled to the second amplifier, in a second mode (block 724). A third output RF signal may be provided with a second stage of the second matching circuit, which is coupled to the first and second input stages, in a third mode (block 726).

The multi-stage matching circuits and amplifiers described herein may be implemented on an IC, an analog IC, an RFIC, a mixed-signal IC, an ASIC, a printed circuit board (PCB), an electronic device, etc. The matching circuits and amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the matching circuits and amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first matching circuit comprising multiple stages configured for selectively coupling in series;
   a second matching circuit comprising multiple stages configured for selectively coupling in series;
   an amplifier coupled to the first and second matching circuits, the first matching circuit provides input impedance matching for the amplifier, and the second matching circuit provides output impedance matching for the amplifier; and
   a selectable signal path from within the first matching circuit to within the second matching circuit that bypasses the amplifier.

2. The apparatus of claim 1, the first matching circuit comprises first and second stages coupled to a first node, and the second matching circuit comprises first and second stages coupled to a second node.

3. The apparatus of claim 2, further comprising:
   at least one switch coupled between the first and second nodes and to bypass or select the amplifier.

4. The apparatus of claim 2, the first node has a first impedance and the second node has a second impedance matching the first impedance.

5. The apparatus of claim 2, the first node has a first impedance and the second node has a second impedance different from the first impedance.

6. The apparatus of claim 1, further comprising:
   a second amplifier coupled in parallel with the amplifier and further to the first and second matching circuits.

7. The apparatus of claim 6, the second matching circuit comprising
   a first input stage coupled to the amplifier,
   a second input stage coupled to the second amplifier, and
   a second stage coupled to the first and second input stages via switches.

8. The apparatus of claim 7, the first and second input stages each has a target output impedance when not coupled to the second stage, and the second stage has the target output impedance when coupled to the first and second input stages.

9. The apparatus of claim 7, the first input stage provides a first output radio frequency (RF) signal in a first mode, the second input stage provides a second output RF signal in a second mode, and the second stage provides a third output RF signal in a third mode.

10. The apparatus of claim 7, the first matching circuit comprises first and second stages coupled to a first node, the apparatus further comprising:
    at least one switch coupled between the first node and the second stage of the second matching circuit, the first stage of the first matching circuit has an output impedance of one half the target output impedance, and the second stage of the second matching circuit has an input impedance of one half the target output impedance.

11. The apparatus of claim 1, the amplifier comprises a power amplifier.

12. The apparatus of claim 11, further comprising:
    a driver amplifier coupled to the first matching circuit, the first matching circuit provides output impedance matching for the driver amplifier; and
    a third matching circuit coupled to the driver amplifier, the third matching circuit provides input impedance matching for the driver amplifier.

13. The apparatus of claim 12, further comprising:
    at least one switch to bypass or select the driver amplifier and the power amplifier.

14. The apparatus of claim 13, the at least one switch is coupled between the third matching circuit and a node between two stages in the second matching circuit, at least one stage in the second matching circuit provides filtering when the driver amplifier and the power amplifier are bypassed.

15. The apparatus of claim 2, the first matching circuit comprises a highpass network for the first stage and a lowpass network for the second stage.

16. The apparatus of claim 2, the second matching circuit comprises a first lowpass network for the first stage and a second lowpass network for the second stage.

17. The apparatus of claim 1, the amplifier comprises a driver amplifier or a low noise amplifier (LNA).

18. The apparatus of claim 1, the first and second matching circuits provide impedance matching for multiple frequency bands.

19. A wireless communication device comprising:
    a first matching circuit comprising multiple stages configured for selectively coupling in series and to a first node;
    a second matching circuit comprising multiple stages configured for selectively coupling in series and to a second node;
    a power amplifier coupled to the first and second matching circuits, the first matching circuit provides input impedance matching for the power amplifier, and the second matching circuit provides output impedance matching for the power amplifier; and
    at least one switch coupled between the first and second nodes and to bypass or select the power amplifier.

20. The apparatus of claim 19, the first node has a first impedance and the second node has a second impedance matching the first impedance.

21. The apparatus of claim 19, further comprising:
    a second power amplifier coupled in parallel with the power amplifier and further to the first and second matching circuits.

22. The apparatus of claim 21, the second matching circuit comprising
    a first input stage coupled to the power amplifier and to provide a first output radio frequency (RF) signal in a first mode,
    a second input stage coupled to the second power amplifier and to provide a second output RF signal in a second mode, and
    a second stage coupled to the first and second input stages via switches and to provide a third output RF signal in a third mode.

23. A method of performing impedance matching, comprising:
    performing input impedance matching for an amplifier with a first matching circuit comprising multiple stages configured for selectively coupling in series;

performing output impedance matching for the amplifier with a second matching circuit comprising multiple stages configured for selectively coupling in series; and selectively bypassing the amplifier from within the first matching circuit to within the second matching circuit.

24. The method of claim 23, further comprising:

bypassing or selecting the amplifier with at least one switch coupled between first and second nodes having a common impedance, the first node being between two stages in the first matching circuit, and the second node being between two stages in the second matching circuit.

25. The method of claim 23, further comprising:

performing input impedance matching for a second amplifier with the first matching circuit, the second amplifier being coupled in parallel with the amplifier; and performing output impedance matching for the second amplifier with the second matching circuit.

26. The apparatus of claim 25, further comprising:

providing a first output radio frequency (RF) signal with a first input stage of the second matching circuit coupled to the amplifier in a first mode;

providing a second output RF signal with a second input stage of the second matching circuit coupled to the second amplifier in a second mode; and providing a third output RF signal with a second stage of the second matching circuit coupled to the first and second input stages in a third mode.

27. An apparatus comprising:

means for performing input impedance matching for an amplifier with a first matching circuit comprising multiple stages configured for selectively coupling in series;

means for performing output impedance matching for the amplifier with a second matching circuit comprising multiple stages configured for selectively coupling in series; and means for selectively bypassing the amplifier from within the first matching circuit to within the second matching circuit.

\* \* \* \* \*